(12) United States Patent
Kolluri et al.

(10) Patent No.: US 6,476,678 B1
(45) Date of Patent: Nov. 5, 2002

(54) HIGH PERFORMANCE AMPLIFIER CIRCUITS USING SEPARATE POWER SUPPLIES

(75) Inventors: Madhav V. Kolluri, Sunnyvale; J. William Maney, Emerald Hills; Christopher F. Edwards, Sunnyvale, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 38 days.

(21) Appl. No.: 09/632,222

(22) Filed: Aug. 4, 2000

(51) Int. Cl.[7] .................................................. H03F 3/20
(52) U.S. Cl. ........................ 330/297; 330/133; 330/100
(58) Field of Search .......................... 330/69, 100, 127, 330/133, 150, 297, 311

(56) References Cited

U.S. PATENT DOCUMENTS 5,083,096 A * 1/1992 Miyazaki ................. 330/133 X
6,259,901 B1 * 7/2001 Shinomiya et al. ...... 330/133 X
6,265,935 B1 * 7/2001 Kaneda et al. .......... 330/297 X

* cited by examiner

Primary Examiner—Steven J. Mottola
(74) Attorney, Agent, or Firm—Blakely, Sokoloff, Taylor & Zafman LLP

(57) ABSTRACT

The present invention is an apparatus and method to provide a high supply rejection and a full rail-to-rail output swing in an amplifier circuit. A first stage generates a first output. The first stage is powered by a second supply. A second stage is coupled to the first stage to generate an amplifier output. The second stage is powered by a first supply. The first and second supplies are different in regulation mode. By making the second supply a low noise supply, the power supply noise amplified by the first stage is minimized, with the voltage gain of the second stage regaining the rail-to-rail swing lost by the first stage due to the regulator supplying very low noise power to the first stage.

13 Claims, 2 Drawing Sheets

HIGH PERFORMANCE AMPLIFIER CIRCUITS USING SEPARATE POWER SUPPLIES

BACKGROUND OF THE INVENTION

1. Field of the Invention

The present invention relates generally to amplifier circuits, and specifically, to high performance amplifier circuits.

2. Background Information

There are many circuit applications that require analog outputs that are minimally degraded by noise on the power supply. Examples of these applications include high quality signal processing, signal conditioning, laptop/notebook computers, cell phones and portable headphone speaker drivers. These applications require analog amplifiers that exist on the same printed circuit board (PCB) as other high speed/high power circuitry and, often, very noisy switch-mode power supplies. These high speed/high power circuits tend to corrupt the power supply voltage, resulting in poor circuit performance. A highly regulated power supply may reduce the effect of noise, but the headroom voltage which is demanded by the regulator is lost for the amplifier and therefore, the output only has a rail-to-rail swing less the headroom loss in the regulator.

Traditionally, an amplifier can either have a good drive capability, i.e., a full rail-to-rail swing but a poor supply rejection or a good supply rejection but poor drive capability. Therefore, there is a need to have an amplifier circuit that has good supply rejection and full rail-to-rail output range without incurring hardware complexity.

SUMMARY OF THE INVENTION

The present invention is an apparatus and method to provide high supply rejection and rail-to-rail output swing in an amplifier circuit. The amplifier circuit includes a first stage that generates a first output. The first stage is powered by one power supply. The amplifier also includes a second stage that is coupled to the output of the first stage to generate an output, which second stage is powered by another supply. The two supplies are different in a regulation mode. In a preferred embodiment, the supply powering the first stage is derived from the other supply through a regulator providing high supply rejection, but not affecting the rail-to-rail swing of the second stage. This minimizes the power supply noise amplified by the first stage, with the voltage gain of the second stage regaining the rail-to-rail swing lost by the first stage due to the regulator supplying very low noise power to the first stage.

BRIEF DESCRIPTION OF THE DRAWINGS

The features and advantages of the present invention will become apparent from the following detailed description of the present invention in which.

DETAILED DESCRIPTION

Figure 1:
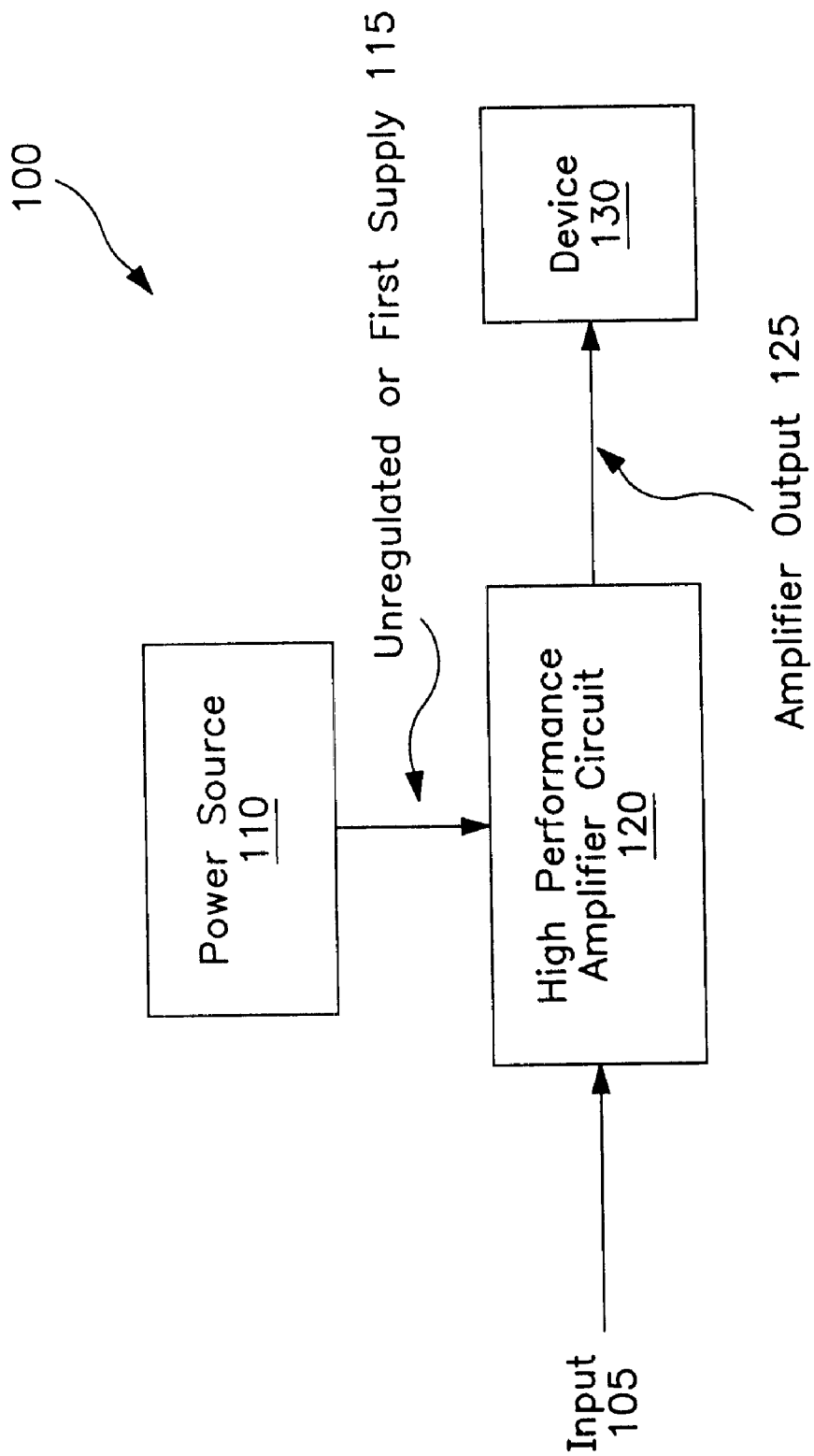
FIG. 1 is a diagram illustrating a system in which one embodiment of the present invention can be practiced.

FIG. 1 is a diagram illustrating a system 100 in which one embodiment of the present invention can be practiced. The system 100 includes a power source 110, a high performance amplifier circuit 120 in accordance with the present invention, and a device 130. The power source 110 provides an unregulated or relatively noisy regulated supply on first supply line 115 to the high performance amplifier circuit 120. In normal operation, the high performance amplifier circuit 120 receives an amplifier input 105 and generates an amplifier output 125 to drive some device or further circuit 130.

The high performance amplifier circuit 120 can be used, by way of example, as a speaker driver amplifier and/or a microphone signal amplifier. The high performance amplifier circuit 120 may perform the usual functions of an amplifier circuit, such as that of a voltage and power gain amplifier. In addition to performing these functions, the high performance amplifier circuit 120 provides a high supply rejection while still generating a full rail-to-rail amplifier output 125. The high supply rejection provides a good quality output, which is robust in the presence of noise or other fluctuations in supply 115. The full rail-to-rail output provides the maximum load driving capability without using expensive components and/or complex hardware.

Figure 2:
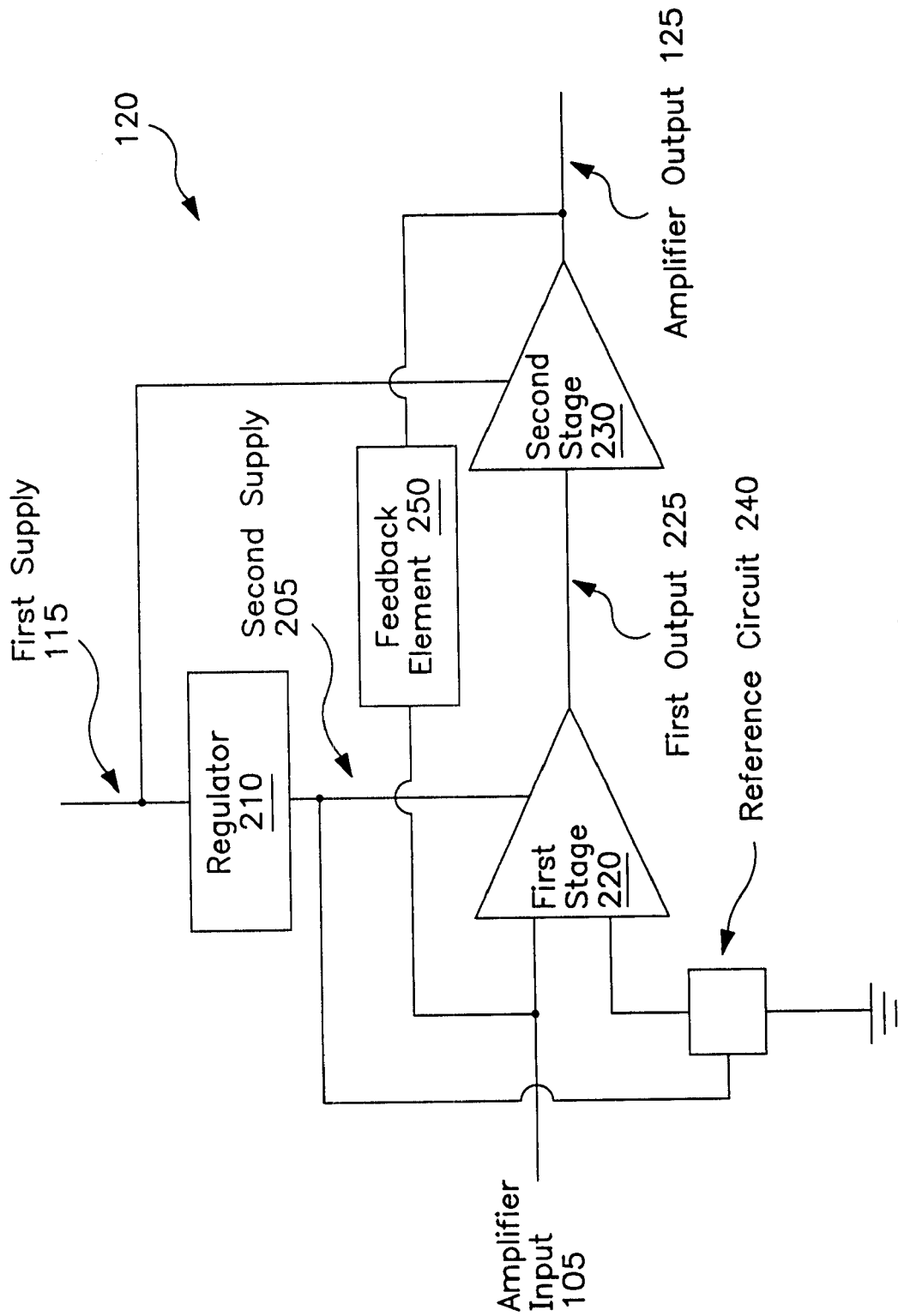
FIG. 2 is a diagram illustrating a high performance amplifier circuit according to one embodiment of the present invention.

FIG. 2 is a diagram illustrating the high performance amplifier circuit 120 shown in FIG. 1 according to one embodiment of the present invention. The high performance amplifier circuit 120 of this embodiment includes a first stage 220 including an input stage and typically providing a substantial voltage gain, a second or output stage 230 and providing further voltage gain, a regulator 210, a reference circuit 240, and a gain control feedback element 250. The first and second stages may be single stages, or either or both may be multiple stages. By way of example, the first stage may be comprised of a differential transistor input pair, or a differential transistor input pair coupled to a gain stage. The second stage may be, by way of example, an output driver or a gain stage coupled to an output driver. The second stage should have voltage gain however, to obtain a first supply rail-to-rail voltage output, as the output of the first stage is limited in any event to the rail-to-rail voltage of the second supply, namely, the output of the regulator 210, which is equal to the first supply rail-to-rail voltage minus the headroom required for the regulator 210.

The first stage 220 receives an amplifier input 105 and generates a first output 225 having minimal power supply noise because of the high degree of power supply noise rejection provided by regulator 210, and whatever regulation may be on the supply 115, if any. Typically the first stage will have gain, but have a low supply power requirement, so that the regulator 210 may be small, designed more for noise rejection than power output. The second stage 230 responds to the output of the first stage 225 to generate an amplifier output 125 to drive the device 130 (shown in FIG. 1). The regulator 210 is powered by the first supply 115 from the power source 110 (shown in FIG. 1) and regulates the first supply 115 to provide a second supply 205, typically a more regulated and substantially less noisy supply. While the second stage should have enough gain to recover the headroom not available to the first stage because of the regulator 210, the gain of the second stage preferably is substantially less than the combined gain of the first and second stages. Consequently the second stage will be much more tolerant of supply noise than the first stage would be because of its lower gain on the effects of noise. In particular, the effect of supply noise on the first stage is amplified by the gain of both stages. The effect of supply noise on the second stage is amplified by the second stage only, which may be a small part of the combined gain of both stages.

The second supply 205 provides a supply voltage appropriate to power the first stage 220. The first supply 115, not subject to the headroom loss of the second supply, provides a higher supply voltage appropriate to power the second stage 230. In one embodiment, the second supply 205 provides a 3.3+/−0.15 volt regulated supply to the first stage 220 and the first supply 115 provides a 5.0+/−0.5 volt unregulated supply to the second stage 230. Thus the first and second supplies are different by how they are regulated. In some applications, the first supply 115 may be unregulated and the second supply 205 regulated. In other applications, the first supply may be regulated, but subject to noise because of the effect of power devices powered by the supply. These may include other devices and even the second stage of the same amplifier, and particularly switching devices powered by the same supply or otherwise coupling to the power supply or supply lines. Also in other embodiments, the second supply need not be powered by the first supply, but may be a separate supply, which typically would be used to power low power, preferably non-switching loads or devices such as, by way of example, the first stages of a number of high performance amplifiers, each in accordance with the present invention. In some exemplary embodiments, the high performance amplifier may be an integrated circuit amplifier with the regulator 210 on chip supplying one or more such amplifiers on the same chip, thereby not increasing the integrated circuit pin count because of the regulator being powered from the same integrated circuit terminals as the second stage, and minimizing the chances of noise coupling to the lines connecting the regulator to the first stage or first stages of the integrated circuit amplifiers.

Thus in the embodiment being described, some significant supply rejection is achieved by the regulator 210 that supplies power (205) to the first stage 220. This is in addition to the supply rejection that is achieved by the first stage 220 with respect to the second supply, 205. In one typical embodiment, the high performance amplifier circuit 120 is used as a driver circuit in which the high performance amplifier circuit 120 achieves a supply rejection of at least 100 dB. The overall supply rejection (with respect to the first supply, 115) is the smaller of the combined supply rejection of both the regulator 210 and the first stage, 220 or the supply rejection of the second stage, 230, divided by the gain of the first stage, 220.

As pointed out before, the first output 225 has less than a full first supply rail-to-rail swing since the first stage 220 is powered by the second supply 205. Therefore, the first output 225 has a full rail-to-rail voltage minus the headroom voltage demanded by the regulator 210. In one exemplary embodiment, the headroom voltage taken by the regulator 210 ranges from 200 to 300 millivolts.

Referring again to FIG. 2, the reference circuit 240 provides a direct current (DC) bias to the first stage 220. The DC bias has a direct influence on the supply rejection of the complete amplifier/regulator combination. Therefore, the reference voltage circuit 240 preferably has the same or better supply rejection as referenced to the first stage input as that of the first stage 220 as driven by the regulator 210.

There are various ways to design voltage reference circuits. In one embodiment, the reference circuit is internal (on chip) to the integrated circuit. However, it should be noted that external reference circuits would be acceptable to provide the reference point to the present invention circuit if properly isolated from noise pickup. Examples of the reference circuit 240 include a cascade of references, such as a zener diode and a bandgap reference. The first or pre-regulator reference may be the zener diode powered by the second supply 205, with the second reference being the bandgap reference which generates the reference signal coupled to the non-inverting input of the first stage 220. The bandgap reference has a very high rejection by itself (~100 dB), and when combined with the pre-regulator reference, the combination provides a rejection of approximately 160 dB.

While the embodiment of FIG. 2 illustrates an amplifier that operates in a single supply system with only a first supply, 115, and ground, the invention is also useful in split-supply systems with an additional regulator used to provide a regulated negative supply. By way of example, the amplifier might require to have a rail-to-rail output voltage swing between a +5 volt and −5 volt supply. The first stage, 220, would therefore require regulated supplies with respect to both the +5 volt and −5 volt supplies. The second stage, 230, would be supplied directly from the +5 volt and −5 volt supplies. In this case, the reference circuit could be eliminated and the non-inverting input grounded.

Furthermore, while the embodiment of FIG. 2 illustrates a single ended input, single ended output amplifier using a reference voltage on the second input of the amplifier, the invention is also useful on fully differential input amplifiers, such as would be obtained, by way of example, by eliminating the reference voltage in favor of a second input to the amplifier. While the differential input may be converted to a single ended output of the amplifier, the invention is also applicable to fully differential amplifiers having both a differential input and a differential output.

In summary, the high performance amplifier circuit has achieved a high supply rejection and a full rail-to-rail output swing. The high supply rejection is achieved by the first stage being powered by a low noise regulated supply. The full rail-to-rail output swing is achieved by the second stage being powered by the unregulated or higher voltage regulated supply. Thus there is no headroom lost in the amplifier output to the low noise regulator. While specific embodiments of the present invention have been disclosed and described in detail herein, it will be obvious to those skilled in the art that various changes in form and detail may be made therein without departing from the spirit and scope thereof.

What is claimed is:

1. An amplifier circuit comprising:
    a first stage to receive an amplifier input and to generate a first output, the first stage being powered by a second supply and having a differential input;
    a second stage coupled to the first stage to receive the first output and to generate an amplifier output, the second stage being powered by a first supply, the first and second supplies being different in regulation mode; and
    a reference circuit, the reference circuit being powered by the second supply, one of the differential amplifier inputs being the output of the reference circuit.

2. The circuit of claim 1, wherein the first supply is an unregulated supply and the second supply is a regulated supply.

3. The circuit of claim 1, wherein the amplifier output has a rail-to-rail swing for the voltage range of the first supply.

4. The circuit of claim 1, wherein the second supply comprises a regulator powered by the first supply.

5. A method for providing high supply rejection and rail-to-rail output swing, the method comprising:
    receiving an amplifier input by a first stage to generating a first output, the first stage being powered by a second supply and having a differential input;

generating an amplifier output by a second stage, the second stage receiving the first output, the second stage being powered by a first supply, the first and second supplies being different in regulation mode; and coupling a reference voltage to one of the differential inputs of the first stage.

6. The method of claim 5, wherein the first supply is an unregulated supply and the second supply is a regulated supply.

7. The method of claim 5, wherein the amplifier output has a rail-to-rail swing for the voltage range of the first supply.

8. The method of claim 5, wherein the second supply comprises a regulator powered by the first supply.

9. An amplifier comprising, in an integrated circuit:

a regulator; and a first stage and a second stage;

the first stage to receive an amplifier input and to generate a first output, the first stage having a differential input;

the second stage coupled to the first stage to receive the first output and to generate an amplifier output;

the second stage and the regulator being powered from a power supply coupled to terminals of the integrated circuit; and, the first stage being powered by the regulator;

a reference circuit, the reference circuit being powered by the second supply, one of the differential amplifier inputs being the output of the reference circuit.

10. The integrated circuit of claim 9, wherein the amplifier output has a rail-to-rail swing for the voltage range of the power supply coupled to the integrated circuit terminals.

11. An amplifier comprising:

an integrated circuit having an inverting input including:

a voltage regulator providing power at a regulated voltage irrespective of voltage variations in power supplied to the voltage regulator; and an amplifier having a first stage and a second stage;

the first stage to receive an amplifier input and to generate a first output;

the second stage coupled to the first stage to receive the first output and to generate an amplifier output;

the second stage and the regulator both being powered from a power supply coupled to terminals of the integrated circuit; and, the first stage being powered by the regulator;

the amplifier further having a gain control feedback element coupled between the amplifier output and the inverting amplifier input.

12. The amplifier of claim 11 wherein the feedback element is part of the integrated circuit.

13. The circuit of claim 11, wherein the amplifier output has a rail-to-rail swing for the voltage range of the power supply coupled to the terminals of the integrated circuit.

* * * * *